United States Patent [19]

Fischer et al.

[11] Patent Number: 4,499,760

[45] Date of Patent: Feb. 19, 1985

[54] DEVICE AND PROCESS FOR HIGH-PRECISION MEASUREMENT OF THE PHASE RELATIONSHIP AND PHASE DISPLACEMENT, RESPECTIVELY, OF TWO PULSE TRAINS

[75] Inventors: Rudolf Fischer, Darmstadt; Nikolaus Spiegel, Georgenhausen Reinheim, both of Fed. Rep. of Germany

[73] Assignee: Heidelberger Druckmaschinen AG, Heidelberg, Fed. Rep. of Germany

[21] Appl. No.: 466,724

[22] Filed: Feb. 15, 1983

[30] Foreign Application Priority Data

Feb. 15, 1982 [DE] Fed. Rep. of Germany ....... 3205240

[51] Int. Cl.³ .................... G01M 13/02; G01P 3/56
[52] U.S. Cl. ........................... 73/159; 73/162; 73/432 R; 324/161; 361/244
[58] Field of Search ............... 73/862.34, 162, 828, 73/829, 159, 432; 324/83 A, 83 R, 86, 161; 361/244; 377/51

[56] References Cited

U.S. PATENT DOCUMENTS

| | | | |
|---|---|---|---|
| 3,038,104 | 6/1962 | Wessels | 324/161 |
| 3,183,436 | 5/1965 | Schmidt et al. | 324/161 |
| 3,832,640 | 8/1974 | Cederquist et al. | 377/51 X |
| 3,882,720 | 5/1975 | Fabish et al. | 73/162 |
| 3,896,377 | 7/1975 | Richardson | 324/161 |
| 3,933,035 | 1/1976 | Roch | 73/829 |
| 4,186,597 | 2/1980 | Brown et al. | 73/862.34 |
| 4,323,976 | 4/1982 | Radaelli et al. | 324/160 X |
| 4,336,711 | 6/1982 | Maehara et al. | 73/162 |
| 4,341,995 | 7/1982 | Hennick et al. | 324/161 |

FOREIGN PATENT DOCUMENTS 920410 4/1982 U.S.S.R. .......................... 73/862.34

Primary Examiner—S. Clement Swisher
Attorney, Agent, or Firm—Herbert L. Lerner; Laurence A. Greenberg

[57] ABSTRACT

Process for high-precision measurement of the phase relationship and phase displacement, respectively, of two pulse trains wherein rotational angles of two rotating bodies are quantized and converted by incremental shaft encoders into pulse trains, and the pulse trains are applicable for calculating the respective phase relationship and phase displacement, which comprises the steps of:

a. counting the pulse trains in at least two different counters;
b. forming a digital difference of the two counts;
c. converting the digital difference into an analog signal;
d. decoding the analog signal; and
e. displaying the decoded analog signal;

and a device for performing the process.

38 Claims, 30 Drawing Figures

Output of Incremental Shaft Encoder for Rotating Body 2

Output of Incremental Shaft Encoder for Rotating Body 1

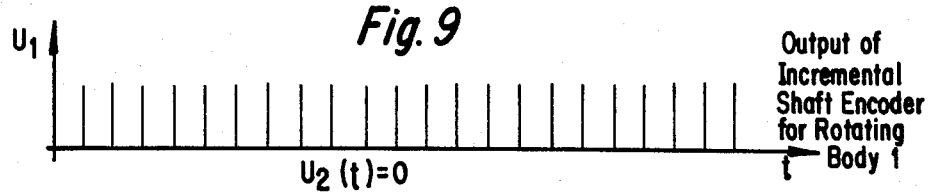
Fig. 9 — Output of Incremental Shaft Encoder for Rotating Body 1
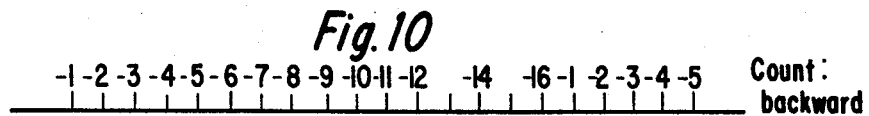
Fig. 10
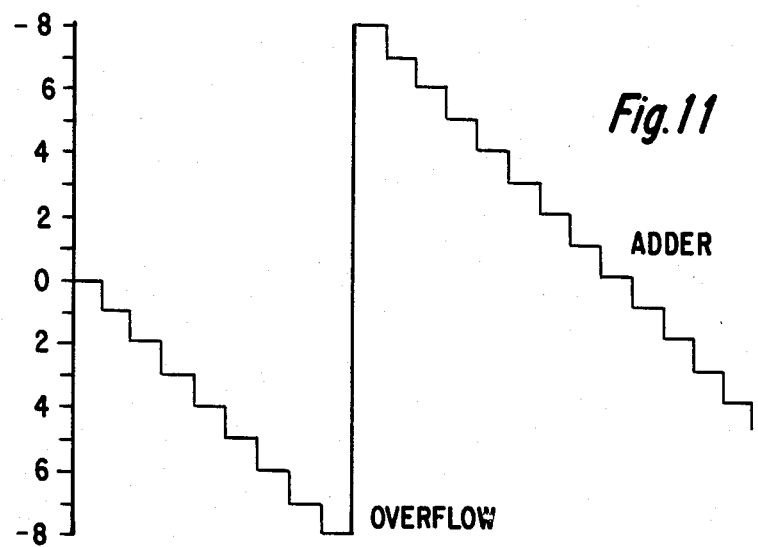
Fig. 11 ADDER
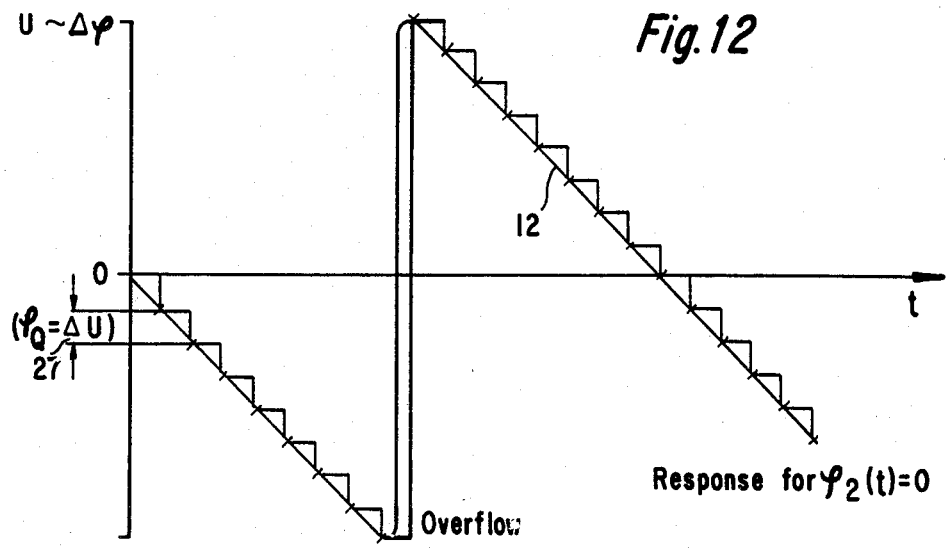
Fig. 12 Response for $\varphi_2(t)=0$

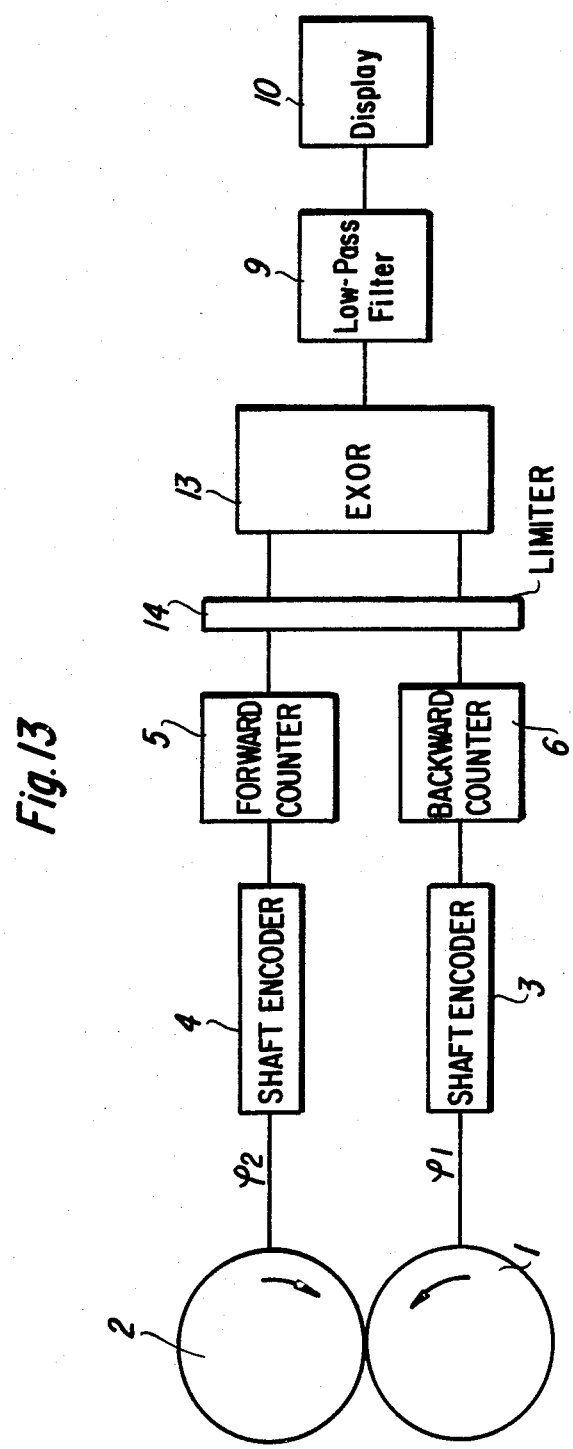

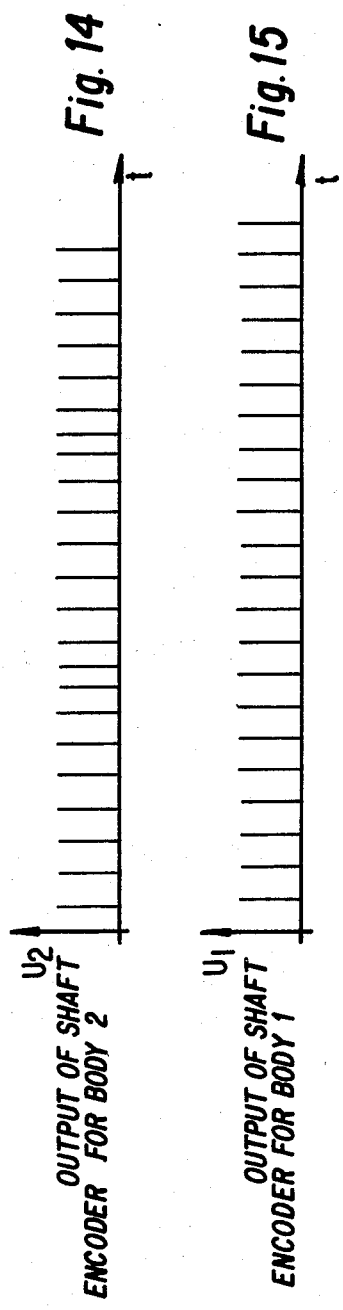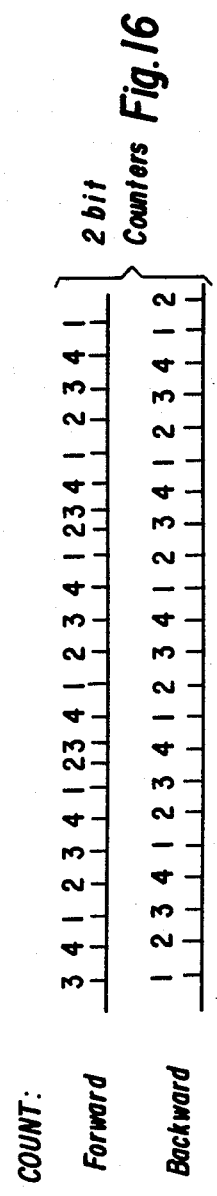

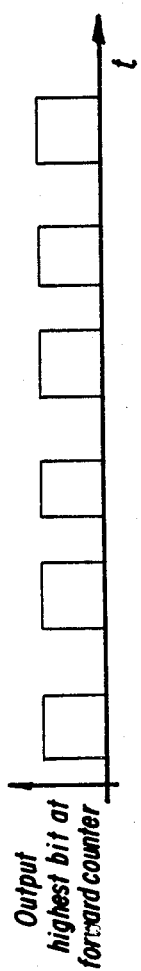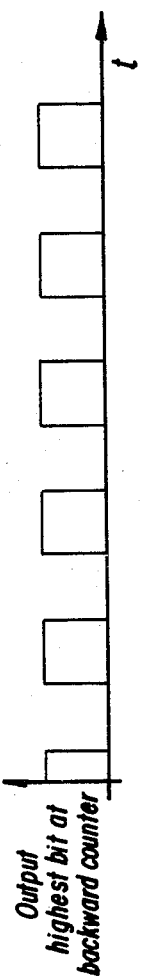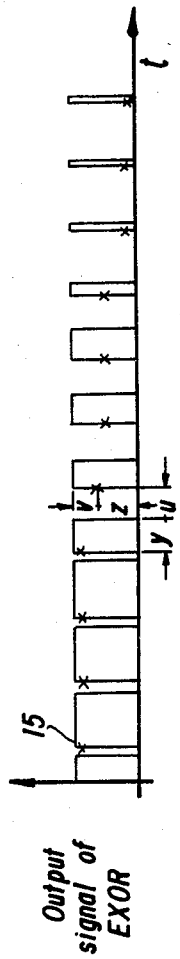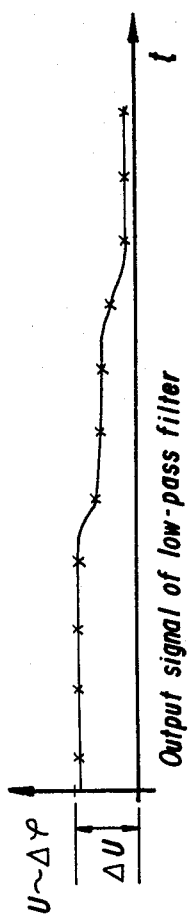

DEVICE AND PROCESS FOR HIGH-PRECISION MEASUREMENT OF THE PHASE RELATIONSHIP AND PHASE DISPLACEMENT, RESPECTIVELY, OF TWO PULSE TRAINS

The invention relates to a process and a device for high-precision measurement of the phase relationship and phase displacement, respectively, of two pulse trains, wherein, for example, the angles of rotation of two rotating bodies are quantized, converted by incremental shaft encoders into pulse trains and the latter used for calculating the phase relationship and phase displacement, respectively.

The prerequisite for the uniform operation of a toothed-gear and friction-gear drive, respectively, is a constant ratio of the angular velocities between the gears of the individual gear pairs. The instant velocity differences occur between the driving and driven gears, synchronism is adversely affected; undesired transmission errors are the result.

Thus, for example, in offset printing presses, regardless of the principle of construction, the drive conditions of the cylinders (plate cylinder, rubber-covered or blanket cylinder and impression cylinder) generally feature several redundancies. Because the cylinders are driven both positively by gearwheels (spur gears) and also by friction through cylinder bearers or Schmitz rings as well as also by contact between the printing plate and rubber-covered or blanket cylinder, an offset printing unit is formed of several three-fold redundant two-cylinder systems. Because the positive drive via the gearwheels constrains the uniformity of the rotational speed of the cylinders, such a system can operate only if there is slip, as an equalizing mechanism, between contact zones which are non-positive, which leads, in turn, to relative movements in the ink-transferring zones which may cause imperfections and quality reductions of the most varied type. To assess the action of an individual drive, respectively, it it necessary to determine the transmission ratios thereof as precisely as possible, completely independently of other existing drives.

A heretofore known method of doing this is to provide the journals of two interacting adjacent cylinders of a printing unit with incremental shaft encoders which, as a function of the graduation or division thereof in accordance with a number N of increments on an encoding disc thereof, deliver a corresponding number of pulses per cylinder revolution through which the angle of rotation is quantized. From quantization to quantization and from pulse to pulse, respectively, an angle $\varphi_Q$ of 360°/N is swept. During the rotation of the two cylinders the outputs of the shaft encoders deliver two pulse trains which, on the other hand, contain the information regarding the momentary angular velocity of the individual cylinders and, on the other hand, also the information about the differential angular velocity thereof. For the exact determination of the transmission ratio, a quotient is formed between the differential angular velocity and the angular velocity of the driving cylinder. After the elimination of the time, the signal represents the differential rotational angle $\Delta \varphi$ accrued over a defined period from the initial reference level, the differential rotational angle being based on the angle covered by the driving cylinder.

The magnitude of this differential angle of rotation per revolution $\Delta \varphi / \mu$ depends upon the respective type of drive. In the case of a positive drive with a transmission ratio of the teeth of $i=1$, the differential angle of rotation is zero over a long term and, in the short term, it fluctuates about zero depending upon the existing tooth error. Precise measurements taken on printing press drives have revealed that the occurring differential rotational angle $(\Delta \varphi)/\mu \leq |10^{-4}|$ and thus lies usually within one quantization (N = 10,000 pulses). In the case of the friction drive via the Schmitz rings or cylinder bearers, the instantaneous as well as the long-term differential angle or rotation may lie within one quantization stage. The different circumferences of the cylinder bearers or Schmitz rings resulting from manufacturing tolerances cause a slow increase in the differential rotational angle in the one or the other direction. For this reason, if it is desired to obtain an exact result, the accuracy of the measurement must be maintained over several quantization stages. In the case of the friction drive via a rubber blanket, the differential rotational angle per revolution is higher by two powers of ten $((\Delta \varphi)/\mu \leq |10^{-2}|)$ than in the case of the positive drive, the slow increase additionally requiring a measuring range extending over several hundred quantization stages.

In another heretofore known measuring method, for example, the two pulse trains i.e. the two frequencies, are converted by frequency-voltage converters into voltages and then the difference between the two voltages is generated in a subtracter. In a following divider, a quotient is formed between the calculated voltage difference and a reference voltage which is generated by one of the two frequency voltage converters. Because the processed voltages correspond to frequencies, the output signal delivers only the time-related change of the differential rotational angle $\Delta \varphi / \varphi = \Delta \omega / \omega$. A disadvantage of this is that the calculation of $\Delta \varphi / \varphi$ is possible only through an elaborate integration of the analog signal without which a concrete statement regarding the instantaneous angular position of the cylinders with respect to a starting position is impossible. When tested close to synchronism i.e. when there are small differential rotational angles $(\Delta \varphi / \mu < |10^{-2}|)$ this method fails totally because the voltages $U_1$ and $U_2$ generated by the frequency-voltage converters are in this case virtually of identical magnitude and the difference between them is nearly zero. Based upon the fact that the frequency-voltage converters inherently exhibit a given residual ripple with the period of the converted frequency in the voltage signal, this ripple being greater than the absolute measured value, the output signal is then determined only by this disturbance, for which reason a useful signal itself is no longer detectable. (FIG. 28)

A new slip measuring method for drive technology discussed in the periodical "Messen, Steuern, Regeln" 2/1981, pages 98 to 102, likewise employs two pulse trains of given frequency generated, for example, by incremental, rotary transmitters. By means of a digital mixer, these two pulse frequencies are used to form the differential frequency which is directly proportional to the differential angular velocity $\Delta \varphi = \Delta \omega$. In contrast with the aforedescribed measuring method, the differential frequency does not contain any information as to whether the value is positive or negative, with the result that it is not possible to ascertain whether an existing transmission ratio is increasing or decreasing. A further disadvantage of this method is that the direction trend of an existing differential rotational angle cannot be determined at all and the absolute value thereof can be determined only by means of elaborate integration. In the case of a differential rotational angle of $\Delta\varphi/\mu \leq |10^{-4}|$, the period of the differential frequency becomes so long that information is available only after one or more cylinder revolutions. (FIG. 29)

The PLL control circuit proposed in the article i.e. multiplication of the differential frequency, is unable to remedy the situation because the transient thereof is likewise at least one period of the differential frequency. Multiplication of the two shaft encoder pulse frequencies before the differential frequency former, as represented in FIGS. 2 and 6 of the article, although, on the one hand, increasing the resulting differential frequency, has the disadvantage, on the other hand, of bringing with it very high pulse frequencies because the multiplication must be by the factor of the increase. These high pulse frequencies very quickly reach the limit frequency of the electronic components, which means of necessity, a limitation of the rotational speed.

A further method described in VDI-Z 122, No. 1/2, 1980 is used in equipment for the single-side roll testing of gearwheels. In this regard, the pulses of two shaft encoders are used for controlling an electronic gating circuit, the pulses of the first shaft encoder opening the gate and the following pulses of the second shaft encoder closing it again. During the time the gate is open, a pulse train, obtained for example by frequency multiplication from one of the two shaft encoders, is let through, the number of pulses let through being proportional to the differential rotational angle present between the cylinders. Because this applies only within one quantization stage, however, the differential rotational angle $\Delta\varphi$, as soon as it becomes greater than one quantization stage, can only be obtained through a complex and thus very costly computer evaluation. The resolution is directly proportional to the selected multiplication factor. When the rotational speed increases, however, exactly as with the method previously described, the generated frequency reaches the limit frequency of the electronic components already in the low speed range. (FIG. 30)

Starting from this state of the art, it is an object of the invention to provide a measuring process and a device for implementing the process for exactly determining, with absolutely uniform accuracy, the phase relationship of two pulse trains obtained preferably from the rotation of two rotating bodies and the phase displacement of the pusle trains, respectively, both within one quantization as well over many quantization stages of the pulse transmitters, irrespective of the pulse frequency and the rotational speed, respectively, of the rotating bodies, and to indicate or display the determined value in an easily processable form, preferably as a differential rotational angle.

With the foregoing and other objects in view, there is provided, in accordance with the invention, a process for high-precision measurement of the phase relationship and phase displacement, respectively, of two pulse trains, which comprises:

1. counting the pulse trains in at least two different counters,
2. forming a digital difference of the two counts,
3. converting the digital difference into an analog signal,
4. decoding the analog signal, and
5. indicating or displaying the decoded analog signal.

With the basic version of the $\Delta\varphi$ measuring process, it is possible to affect a considerably finer resolution of the differential rotational angle $\Delta\varphi$ than one quantization although, with this resolution, $\Delta\varphi$ can be measured with absolutely identical accuracy over several quantizations, the process remaining effective, however, in the worst case with the accuracy of the quantization, even in the case of impermissibly low frequencies. Furthermore, the accuracy of the measuring process is independent of the pulse train frequency. The sign (positive or negative) of the differential rotational angle $\Delta\varphi$ is also given by the sign of the decoded analog signal.

In an alternative process according to the invention, the following steps are performed:

1. dividing the measuring range as a function of the phase angle, into a precounter measuring range and an overflow counter measuring range,
2. counting the pulse trains in at least two different counters of a precounter measuring unit,
3. forming a digital difference of the two counts of the precounter measuring unit,
4. converting the digital difference of the precounter measuring unit into a first analog signal,
5. scanning the precounter measuring unit for positive or negative overflow,
6. in case of overflow, generating appropriate overflow pulses,
7. in case of a delivery of overflow pusles, inverting the highest bit at the adder output of the precounter measuring unit,
8. counting the positive overflow pulses and the negative overflow pulses, respectively, in two different counters of an overflow counter measuring unit,
9. forming a digital difference of the two counts of the overflow counter measuring unit,
10. converting the digital difference of the overflow counter measuring unit into a second analog signal,
11. analogically adding the first and second analog signals to form a third analog signal,
12. decoding the third analog signal, and
13. indicating or displaying the decoded third analog signal.

A particular advantage of this alternative version of the process according to the invention is that, by dividing the measuring range, a considerably higher limit frequency (1 MHz) is attainable. Furthermore, the decoding may be effected by means of a relatively simple low-pass filter of the first order.

In yet another version of the process according to the invention, the counter capacities are limited in accordance with the occurring phase angle $\Delta\varphi$, and the process includes forming a digital difference of the two counts of the precounter and of the overflow counter, respectively, with simultaneous conversion of the digital difference into an analog signal. This process is realizable with simple and inexpensive modules without loss of any measuring accuracy and may be used to advantage particularly when the differential rotational angle $\Delta\varphi$ varies within a fixed, known range and, simultaneously, the pulse train frequencies are very high.

For the purpose of advantageously processing the $\Delta\varphi$-proportional analog signal e.g. for determining the transmission ratio of drives or for controlling the synchronism of two drives, there is an additional version of the $\Delta\varphi$ measuring process which comprises the following steps:

1. generating a scanning interval,
2. setting and storing the scanning interval,
3. resetting the phase angle at the start of the scanning interval to zero, 4. storing the phase angle accrued during the scanning interval,
5. newly resetting the phase angle after termination of the scanning interval, and
6. indicating or displaying the stored phase angle per scanning interval.

In a further additional measuring process according to the invention, which is particularly suitable for determining the differential frequency of the pulse trains, which is proportional to the differential angular velocity, if the direction of the differential angular velocity is given by the system, the analog signal which is intended for the indication or display and which is proportional to the differential rotational angle $\Delta\varphi$ is used for determining the frequency.

Further advantageous embodiments of the invention of the instant application and advantages deriving therefrom are described in the specification hereinafter as well as in the claims at the end thereof.

Other features which are considered as characteristic for the invention are set forth in the appended claims.

Although the invention is illustrated and described herein as embodied in a device and process for high-precision measurement of the phase relationship and phase displacement, respectively, of two pulse trains, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

FIGS. 9 to 12 are plot diagrams showing the status and changes of status, respectively, of the signal in the measuring device according to FIG. 1 for the limiting case $\varphi_2(t)=0$.

FIG. 13 is a schematic and diagrammatic view of a measuring device for implementing a modified basic $\Delta\varphi$ measuring process according to the invention;

FIGS. 14 to 20 are plot diagrams showing the status and changes of status, respectively, in the measuring device according to FIG. 13;

Figure 1:
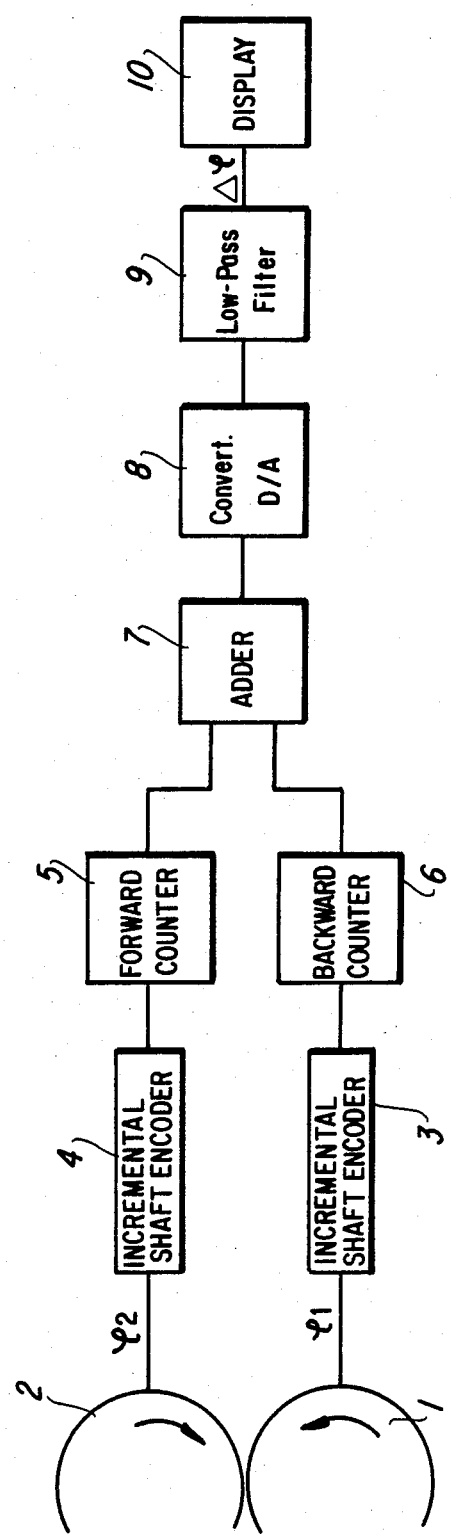
FIG. 1 is a schematic and diagrammatic view of a measuring device for implementing a basic measuring process according to the invention.

Referring now to the drawings and first particularly to FIG. 1 thereof, there is represented a basic $\Delta\varphi$ measuring process wherein rotational angles $\varphi_1$ and $\varphi_2$ are measured and quantized by means of two incremental shaft encoders 3 and 4 in accordance with steps represented from the hardware point of view in a form of construction of a measuring device. It is assumed, in this respect, that the two rotating bodies 1 and 2 have sufficient inertial mass to prevent any sudden changes in the rotary angular velocity and thus in the differential rotation angle. The rotational angles $\varphi_1$ and $\varphi_2$ are subdivided into individual angle steps 27 (note FIGS. 2 and 3) which are dependent upon the existing number N of increments on the encoding and pulse discs, respectively, of the two incremental shaft encoders 3 and 4, an individual angle step from increment to increment being $\varphi_Q = 360/N$. A pulse is generated by each incremental shaft encoder 3 and 4, respectively, per angle step 27.

The incremental shaft encoder 4 is followed by a counter 5, and the incremental shaft encoder 3 by a counter 6. The counters 5 and 6 may be either two digital forward counters, two backward counters, or, instead, one forward counter and one backward counter. During the rotation of the two rotating bodies 1 and 2, the two pulse trains generated by the incremental shaft encoders 3 and 4 are counted in the two counters 5 and 6 which, in the basic system shown in FIG 1, are formed, by way of example, of a forward digital counter 5 and 6 backward digital counter 6 each with 4 bits, and thus having a counting capacity of 1 to 16. Because the pulse trains, however, deliver a considerably higher number, the forward digital counter 5 runs over or overflows when the number 16 is reached, and starts again at the number 1, counting on again as far as the number 16, and so forth. The backward digital counter 6 behaves in the same manner. If it is not the rotational angle $\varphi$, but rather the differential rotational angle $\Delta\varphi$ which is being sought, during the measurement, overflowing or running-over of the counters is of no importance.

The two digital counters 5 and 6 are connected to a common difference former 7 which, depending upon the type of computers used, may be in the form of a digital adder or digital subtracter. The digital adder 7 used in the basic $\Delta\varphi$ measuring process now forms the difference between the incoming pulses by adding the counts of the two digital counters 5 and 6, the number at the output of the digital adder 7 representing the output without overflow or runover bits. The maximum measurable differential rotational angle max is limited by the capacity of the digital counters 5 and 6 as well as of the digital adder 7. If, alternatively, use is made, respectively, of two forward counters or two backward counters, the difference former 7 is in the form of a digital subtracter which produces the difference of the two counts by means of digital subtraction.

The output of the digital adder 7 is connected to a digital/analog converter which is followed by a low-pass filter 9. The low-pass filter 9 is coupled to a succeeding indication or display device 10.

Figure 2:
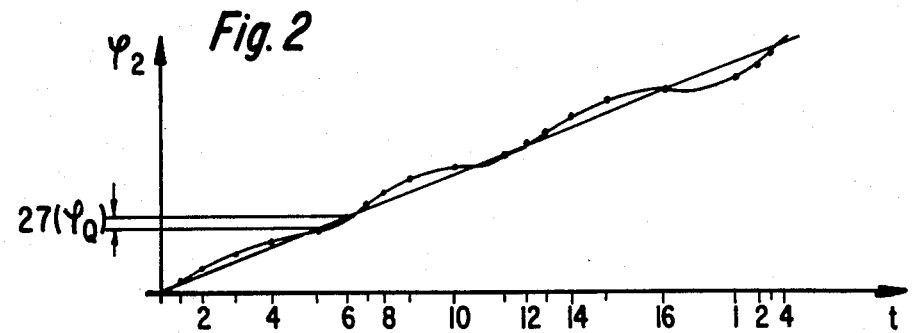
FIGS. 2 to 8 are plot diagrams showing the status and changes of status of the signal, respectively, in the measuring device according to FIG. 1.
Figure 3:
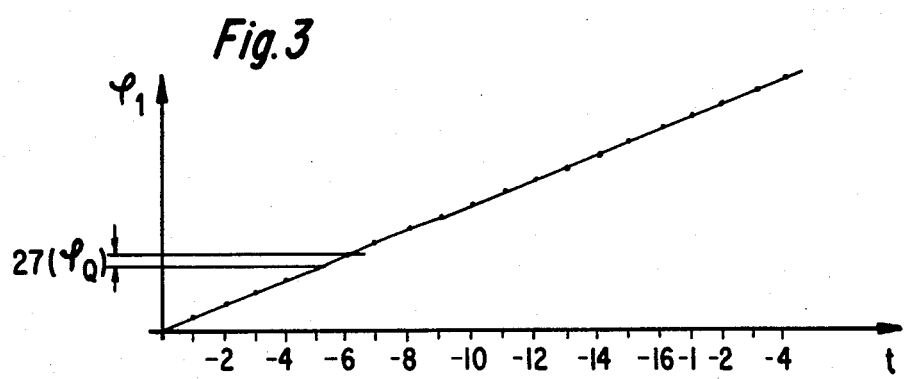

With reference to FIGS. 2 to 8, it is possible to follow the signals occurring during the basic $\Delta\varphi$ measuring process. In FIGS. 2 and 3, the rotational angles $\varphi_2$ and $\varphi_1$ are represented quantized as a function of time t into individual angle steps $\varphi_Q$ (quantization stage 27). The graph in FIG. 2 shows the physical quantities actually occurring due to the irregularity of the drive e.g. as a result of toothing errors, the non-linearity of the rotational angle curve being attributable to the partial lead and partial lag of the rotational angle $\varphi_2$. This explains the variation in the time spans between the individual quantization stages 27. In the graph with a linearly rising curve of the rotational angle $\varphi_1$ shown in FIG. 3, it has been assumed that the drive is uniform and that the rotation angle $\varphi_1$ increases linearly with time t. Thus, the spans of time between the individual quantization stages 27 remain constant.

Figure 4:
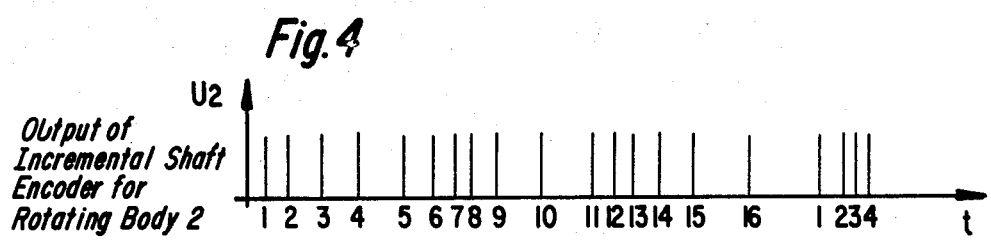
Figure 5:
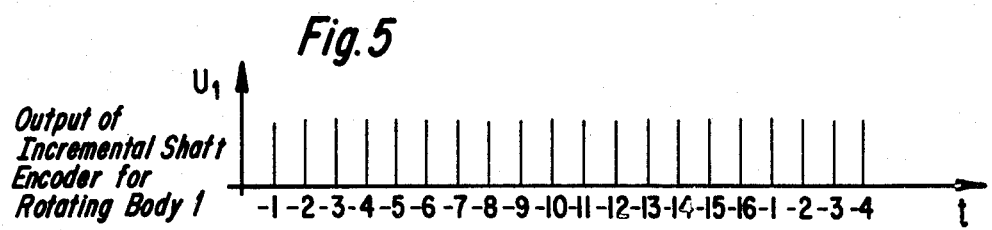

In FIGS. 4 and 5, the pulses and pulse trains, respectively, coming from the incremental shaft encoders 3 and 4 are represented and are expressed as voltages $U_2$ and $U_1$ expressed as a function of the time t. Depending upon the non-linearity of the rotational angle $\varphi_2$, the pulse diagram in FIG. 4 yields an irregular pulse train as a function of time, whereas in the pulse diagram in FIG. 5, the time span between the individual pulses remains unchanged in accordance with the linearity of the rotation angle $\varphi_1$.

Figure 6:
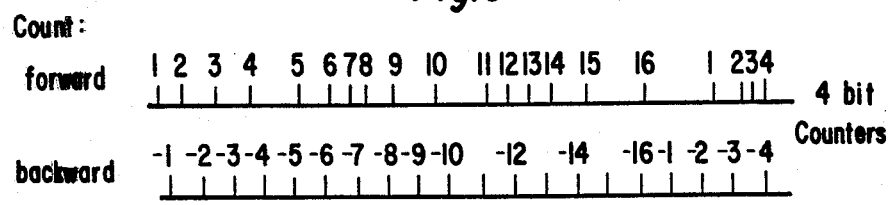

In FIG. 6, the counts of the two digital counters 5 and 6 are shown symbolically in real terms as digital numbers. While the upper sequence of numbers in FIG. 6 represents the count of the forward digital counter 5, the lower sequence shows the count of the backward digital counter 6. Because, as explained hereinbefore, the digital counters 5 and 6 in the measuring device or system for implementing the basic $\Delta\varphi$ measuring process according to FIG. 1 are, by way of example, in the form of 4-bit counters, they overflow or run over when they reach the number 16 and begin counting again at the number 1.

Figure 7:
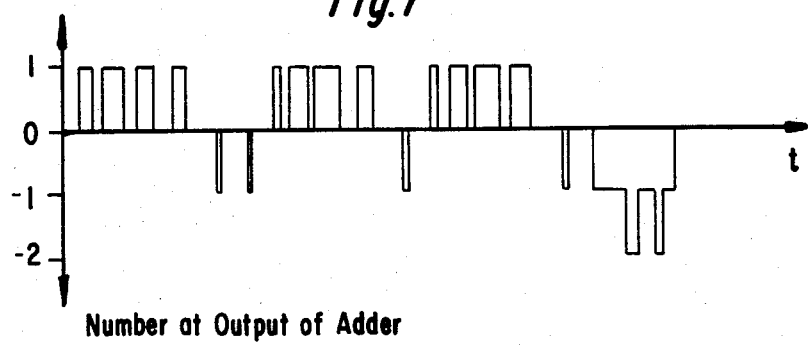

The step diagram in FIG. 7 shows the digital numerical value which results from the digital addition of the counts of the two digital counters 5 and 6 without overflow or run-over bits. Consequently, the results of this addition is present at the output of the digital adder 7. To each of the numerical values plotted on the ordinate a respective specific voltage value is assigned. When the forward digital counter 5 has the number 1, the output of the digital adder 7 has the digital numerical value 1 which is kept until the number −1 of the backward digital counter 6 is added digitally. In that instant, the numerical value at the output of the digital adder 7 drops to the value 0 which, in its turn, is kept until the number 2 of the digital forward counter 5 is added. At the output of the adder, there is then a 1 until the −2 of the digital backward counter 6 is added, and so forth.

Figure 8:
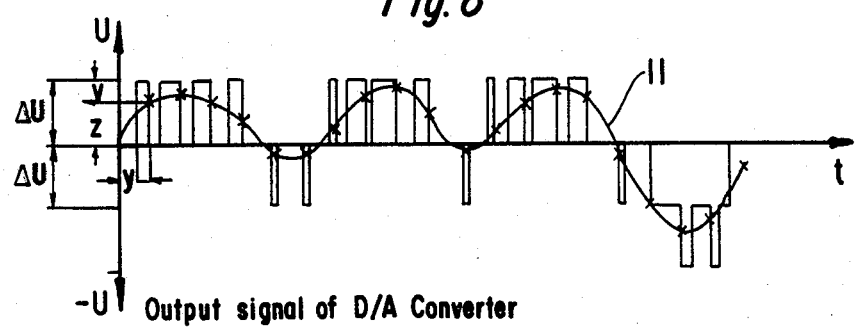

In FIG. 8, both the output signals of the digital-/analog converter 8 as well as the output signals of the succeeding low-pass filter 9, both as voltage U, and both as a function of the time t. The output signals of the digital/analog converter 8 are based on the same values as used in the step diagram in FIG. 7, but which the difference that the numerical values thereof are converted only into voltage steps. The analog signal at the output of the digital/analog converter 8 changes in accordance with the pulse difference number at the output of the digital adder 7. The information regarding the differential rotational angle $\Delta\varphi$ is then for each quantization of the reference pulse train, in the pulse duty factor $u/y=v/z$ and in the voltage step of the output signal of the digital/analog converter 8. Because, as mentioned hereinbefore, the differential rotational angle $\Delta\varphi$ is prevented from changing suddenly by the inertial mass of the two rotating bodies 1 and 2, the individual values can be used to generate a continuous curve of the differential rotational angle $\Delta\varphi$.

The individual values of the differential rotational angle $\Delta\varphi$ contained in encoded form in the pulse duty factor and in the voltage steps are converted in the low-pass filter 9 by decoding into a continuous analog signal of the differential rotational angle which is represented in FIG. 8 as a voltage curve 11. This decoding results in a resolution of the differential rotational angle $\Delta\varphi$ which is much finer than one quantizational stage 27 of the incremental shaft encoders 3 and 4.

If the maximum, normally countable pulse difference in one direction is exceeded, then, in order to determine the actually accumulated pulse difference, it is necessary to take account both of the direction as well as the number of overflows or runs-over in the two digital counters 5 and 6.

The four graphs in FIGS. 9 to 12 show, by way of example, the limiting case for $\varphi_2(t)=0$, the incremental shaft encoder 3 generating a pulse train with respectively equal time intervals between the individual pulses as shown in FIG. 9. Of course, in this case, only the backward digital counter 6 comes into action and precisely in the manner described above and represented in the diagram of FIG. 10.

Because only the backward digital counter 6 is in operation, and the forward digital counter 5 is not in operation, the succeeding digital addition results exclusively in the numerical value of the backward digital counter 6 which is thus also present at the output of the digital adder 7. Because the pulse difference 0 is set in the middle of the counter capacity in a conventional manner (binary offset code) in order to be able to make measurements in both directions i.e. into the positive and negative ranges, this numerical value increases up to the number −8. At −8 there is an overflow or run-over, and the addition starts anew (FIG. 11).

The digital value at the output of the digital adder 7 is converted into an analog voltage signal U which is proportional to the differential rotation angle $\Delta\varphi$ and which is shown in FIG. 12. The analog voltage values change from quantization stage to quantization stage at the adder output in accordance with the difference in the number of pulses. The decoded and averaged output signal of the low-pass filter 9 for the case $\varphi_2(t)=0$ is shown in FIG. 12 and is identified by the reference number 12.

With this variation in the basic $\Delta\varphi$ measuring process, it is possible to obtain considerably finer resolution of the differential rotational angle $\Delta\varphi$ than one quantization stage 27. Nevertheless, with this resolution $\Delta\varphi$, measuring can be effected with absolutely uniform accuracy over several quantization stages 27. The accuracy is independent of the magnitude of the pulse train frequency. Even in the case of impermissibly low frequencies which, for example, may be caused by incorrect tuning of the low-pass filter 9, the process operates nevertheless in the worst case with the accuracy of the quantization of heretofore known state-of-the-art processes i.e. in this case the signal is virtually unfiltered. The sign (negative or positive) of the differential rotational angle is given by the sign of the filtered analog signal.

In the case of deviations in the differential rotational angle $\Delta\varphi$ within a fixed, known range and/or in the case of high pulse frequency, use is made of a modified basic $\Delta\varphi$ measuring process which permits a solution using relatively simple and inexpensive modules without losing out on accuracy thereby.

FIG. 13 shows the setup or system for implementing this modified basic $\Delta\varphi$ measuring process, the construction of which is identical essentially with the measuring device or system of the basic $\Delta\phi$ measuring process as shown in FIG. 1, except for the modification which is that the digital adder 7 as well as the digital/analog coverter 8 of the basic $\Delta\varphi$ measuring process are realized jointly in an exclusive OR gate 13, called exor for short. A limiter 14 is connected forward of and to the exor 13. The digital addition of the numerical values of the two digital counters 5 and 6 as well as the digital-/analog conversion of the digital result are performed simultaneously in the exor 13. As in the basic $\Delta\varphi$ measuring process, the low-pass filter 9 as well as the succeeding indication or display device 10 conclude the measuring device.

With reference to FIGS. 14 to 20, the operating principle of the modified basic $\Delta\varphi$ measuring process or system is described hereinbelow in greater detail.

Following the quantization of the angles $\varphi_1$ and $\varphi_2$, the pulse trains of the incremental shaft encoders 3 and 4 shown in FIGS. 14 and 15 are transmitted, in the hereinafter described type of the basic $\Delta\varphi$ measuring process, to the forward and backward digital counters 5 and 6, the capacity of which is selected by the limiter 4 so that the largest reproducible number is greater than or equal to the number of quantization stages 27 assumed by the differential rotational angle $\Delta\varphi$.

In the example shown in FIG. 16, the differential rotational angle $\Delta\varphi$ has a maximum of four quantizations so that the digital counters 5 and 6 are in the form of 2-bit counters with a counting capacity of 4. In contrast to the basic $\Delta\varphi$ measuring process, not all bit locations of the digital counters 5 and 6 are then used for addition, but only the state of the highest bit is taken into consideration. The digital counters 5 and 6 thus work as frequency dividers because a change in state or status occurs, depending upon the number of bits or bit steps, only after every 2, 4, 8 and so forth, pulses.

The two analog signals of FIGS. 17 and 18 present at the output of the 2-bit digital counters 5 and 6 are then transmitted to the input of the exor 13. The output of the latter delivers a specific analog voltage signal only when the state or status of the two digital counters 5 and 6 is identical i.e. only when both have a voltage or when both are at zero voltage. If the state or status of the two digital counters 5 and 6 is not identical, there is no voltage at the output of the exor 13. Accordingly, the step diagram represented in FIG. 19 is produced, the values of $\Delta\varphi$ per two quantization stages (2-bit counters) being identified by the reference numeral 15. The output signal of the exor 13 in FIG. 19 corresponds to that of a single-stage adder and of a single-stage digital/analog converter.

The information regarding the differential rotational angle $\Delta\varphi$ is in the pulse duty factor of the signal $u/y=v/z$ which is represented in FIG. 19 and which has previously been explained herein in detail in the discussion of the basic $\Delta\varphi$ measuring process. In order to be able to make an analog statement on the differential rotational angle $\Delta\varphi$, it is necessary, therefore, as with the basic $\Delta\varphi$ measuring process, to decode the output signal of the exor 13 by means of the low-pass filter 9 before this signal is displayed or indicated. The decoded voltage signal 11 is shown in FIG. 20.

By increasing the counting capacity, although with this modified basic $\Delta\varphi$ measuring process there may be a slight reduction in accuracy since only the highest bit is counted, the accuracy is still nevertheless considerably greater than in heretofore known state-of-the-art measuring processes. Assuming the initially mentioned conditions, the essential advantage of this modified basic $\Delta\varphi$ measuring process is that very high pulse train frequencies can be processed with a minimum of cost through the use of simple commercially available modules because the limit frequency of the logic module used, exor 13, is considerably higher than that of the digital/analog converter 8.

Figure 21:
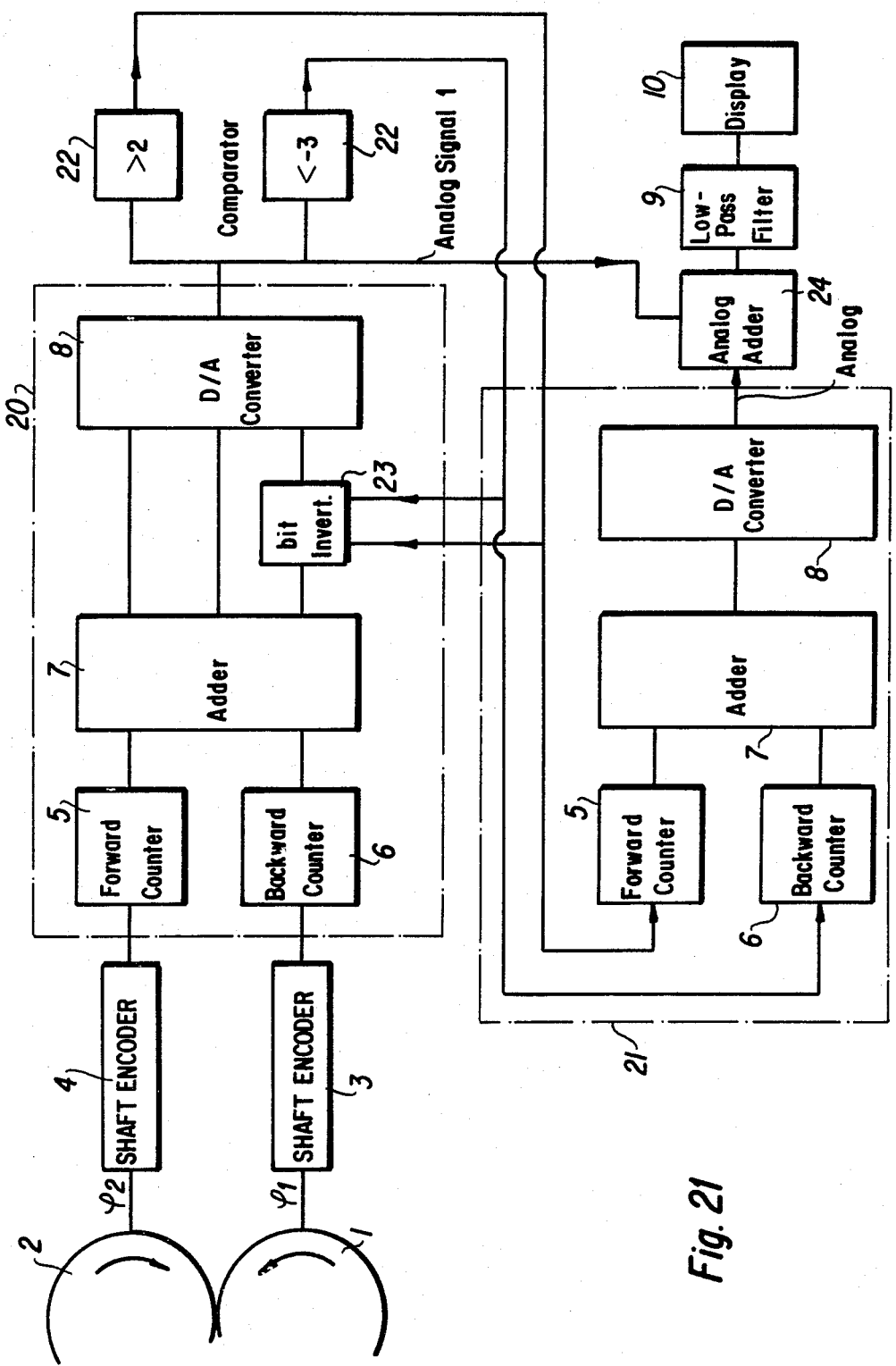
FIG. 21 is a schematic and diagrammatic view of a measuring device for implementing a second $\Delta\varphi$ measuring process equivalent to the basic $\Delta\varphi$ measuring process according to the invention.

The initially set problem may be solved likewise with a second $\Delta\varphi$ measuring process which is equivalent to the basic measuring process. This second $\Delta\phi$ measuring process is used in particular for measuring extremely high pulse train frequencies e.g. 1 MHz, because the digital/analog converter 8 of the basic process is limited in the processing of high pulse train frequencies. The individual process steps of this second measuring process are shown from the hardware point of view in FIG. 21, and the operating principle thereof is explained below with referennce to FIGS. 22 to 24.

In order to achieve an increase in the limit frequency, the measurement of the differential rotational angle $\Delta\varphi$, in this process, is divided into two measuring ranges, a precounter measuring range and an overflow or run-over counter measuring range. This splitting or diversion of the measuring range means that components 5 to 8 of the system for performing the basic $\Delta\varphi$ measuring process appear in duplicate in the system for performing the second measuring process, the first unit of components 5 to 8 being used as the precounter measuring unit 20 and the second unit of the components 5 to 8 as the overflow or run-over counter measuring unit 21. The two digital counters 5 and 6 of the precounter measuring unit act exclusively as precounters and are connected, in the same manner as in the system for performing the basic $\Delta\varphi$ measuring process, when there is positive and negative overflow of the two digital counters 5 and 6 of the precounter measuring unit 20. The following truth table shows the internal representation of numbers in the, for example 3-bit, digital counters 5 and 6 of the precounter measuring unit 20.

| Truth Table | LLL | 3 |
|---|---|---|
| | LLO | 2 |
| | LOL | 1 |
| | LOO | 0 |
| | OLL | −1 |
| | OLO | −2 |
| | OOL | −3 |
| | OOO | −4 |

Figure 22:
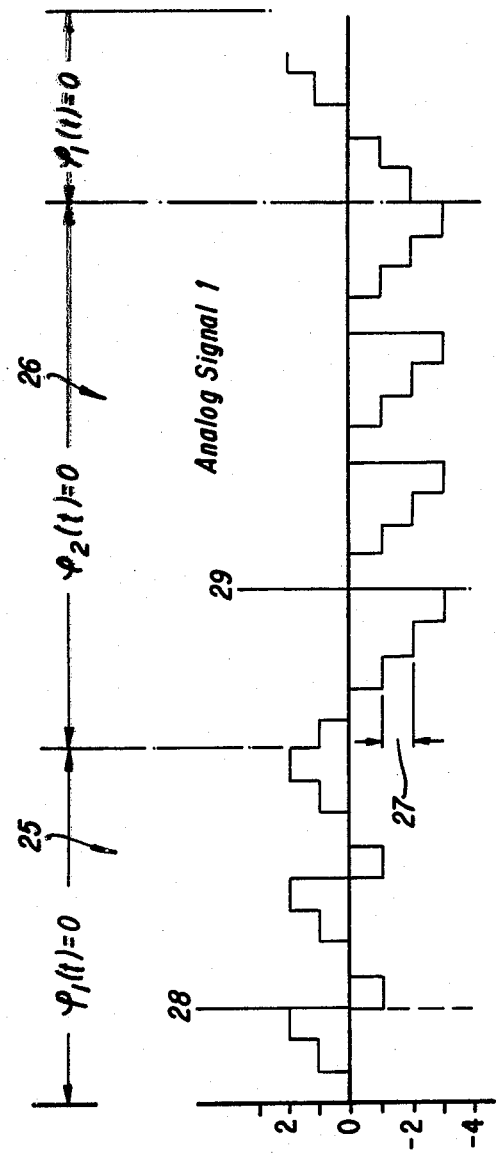
FIGS. 22 to 24 are plot diagrams showing the status and changes of status of the signal in the measuring device according to FIG. 21.
Figure 23:
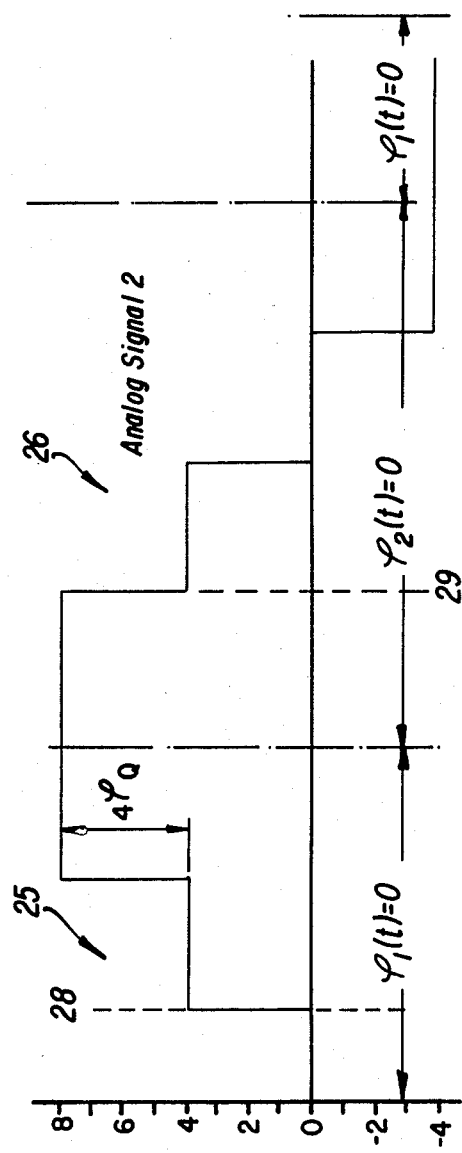
Figure 24:
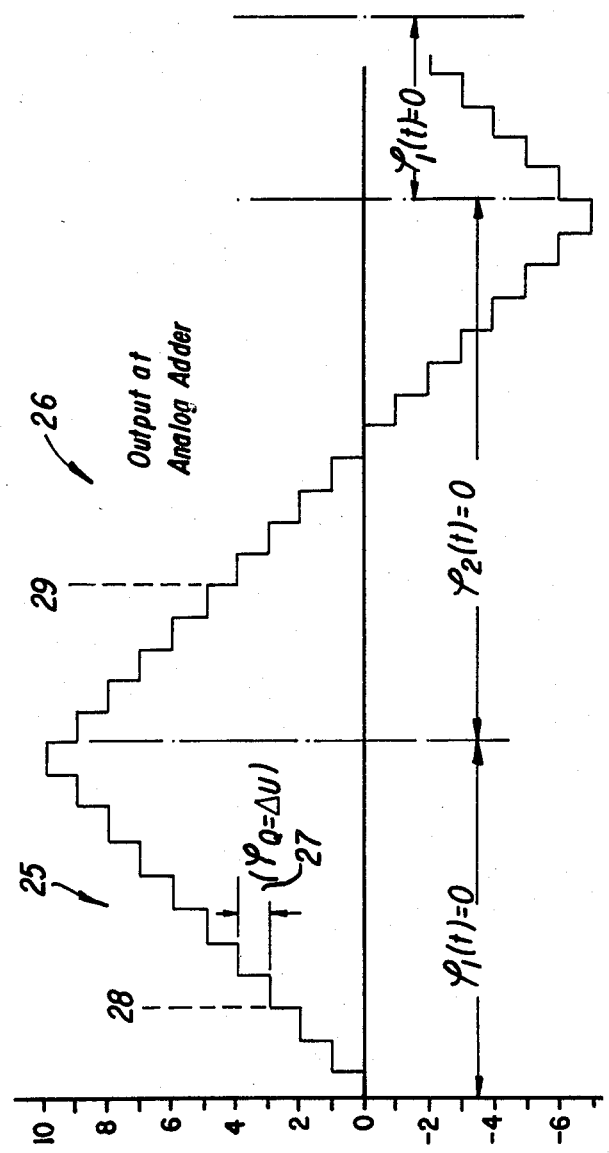

The step diagram in FIG. 22 shows the first analog signal present at the output of the precounter measuring unit 20, assuming that in the first curve-half identified by reference numeral 25, $\varphi_1(t)=0$ and in the second curve-half 26, $\varphi_2(t)=0$. If the measurement begins with a differential rotational angle $\Delta\varphi=0$ and if the width of deviation of $\Delta\varphi$ is less than four quantization stages 27, then the forward digital counter 5 of the precounter measuring unit 20 is in operation exclusively, in accordance with the signals shown in the first curve-half 25. Accordingly, there is no second analog signal at the output of the overflow counter measuring unit 21 during this time, with the result that the output thereof has the analog value O (FIG. 23). As shown in FIG. 24, the output of the analog adder 24 also has the value of the first analog signal of the precounter measuring unit 20 exclusively, and holds this analog signal until the forward digital counter 5 of the overflow counter measuring unit 21 starts with its counting work.

Per quantization stage 27, the forward digital counter 5 of the precounter measuring unit 20 counts up one until, according to the truth table, it reaches =2 at LLO. If the differential rotational angle $\Delta\varphi$ is greater than two quantization stages 27 in the positive direction, then the forward digital counter 5, which is only in the form of a 3-bit counter, changes according to the truth table at LLL to $-1=$ OLL because, controlled by the analog comparator 22, the highestbit of the digital adder 7 of the precounter measuring unit 20 is inverted by the bit inverter 14. Thus, it is not the logical numerical value 3, but instead the value $-1$ which is present at the output of the digital/analog converter 8 of the precounter measuring unit 20.

Simultanously with the bit inversion by the bit inverter 23, a pulse is delivered to the forward digital counter 5 of the overflow counter measuring unit 21. Since this counter counts only in steps of four, such a pulse results in the value 4 on the analog side of the digital/analog converter 8 of the overflow counter measuring unit, 21, as represented in the diagram in FIG. 23 which shows the second analog signal present at the output of the overflow counter measuring unit 21.

The state within the measuring device has thus changed at the inversion step identified in FIGS. 22 to 24 by the reference numeral 28 from the value 2 in the forward digital counter 5 of the precounter measuring unit 20 to the value $-1$, and from the value 0 in the forward digital counter 5 of the overflow or run-over counter measuring unit 21 to the valve 4. Through the analog addition of the first analog signal of the precounter measuring unit 20 with the second analog signal of the overflow counter measuring unit 21 there is thus the analog numerical value 3 at the output of the common analog adder 24, as shown in FIG. 24, each numerical value shown in this diagram being assigned a specific voltage value and each quantization stage being assigned a corresponding voltage difference.

In the event the direction of the differential rotational angle $\Delta\varphi$ varies in accordance with the representation in the second curvehalf 26 in FIG. 22 assuming that $\varphi_2(t)=0$, the backward digital counter 6 of the precounter measuring unit 20 counts backwards from the instantaneous state e.g. 2 to $-3$. If this value is exceeded, then likewise controlled by the analog comparator 22, the highest bit of the digital adder 7 of the precounter measuring unit 20 is inverted by the bit inverter 23. Because the value $-4$ is unstable and, according to the truth table, jumps from the state 000 back to the value $0=$LOO, it is not the value $-4$, but the valve 0 which is present at the output of the digital/analog converter 8 of the precounter measuring unit 20.

Simultaneously with the jumping back of the backward digital counter 6 of the precounter measuring unit 20 to the value 0, a pulse is transmitted to the backward digital counter 6 of the overflow or run-over counter measuring unit 21, as a result of which the backward digital counter 6 of the overflow counter measuring unit 21 makes a 4-step jump, and the value at the analog output of the digital/analog converter 8 of the overflow counter measuring unit 21 drops simultaneously by 4 in the inversion step identified by reference numeral 29 in FIGS. 22 to 24. Thus, the jump in value fom $-4$ to 0 at the analog output of the digital/analog converter 8 of the precounter measuring unit 20 is again balanced out in the succeeding final analog addition. The value of $-3$, for example, of the precounter measuring unit 20 and the value 8 of the overflow counter measuring unit 21 i.e. the totalized or summed value of 5, then becomes the value 0 in the precounter measuring unit 20 through bit inversion and the value 4 in the overflow counter measuring unit 21. The analog addition of these two signal values yields the summed or totalized value of 4 in accordance with the corresponding voltage step in the diagram in FIG. 24.

This mode of counting means that the overflow counter measuring unit 21 with the slower digital/analog converter 8 (operating over 12 bits, for example) has to change its state considerably less often. The simultaneous changing of a great many bit locations e.g. for 12 bits from LOOOOOOOOOOO to OLLLLLLLLLLL and vice versa, with the pulse train frequency and the ensuing long transient time is avoided by the precounter measuring unit 20, because the counting work is divided between both counter measuring units 20 and 21.

To all appearances, the second $\Delta\varphi$ measuring process with the process steps 1 to 13 thereof is like the basic process with the process steps 1 to 5 thereof, but the limit frequency is considerably higher. The subsequent decoding of the analog signal present at the output of the analog adder 15 is performed in the same manner as in the basic $\Delta\varphi$ measuring process by means of a low-pass filter 9, it being preferable to use a simple low-pass filter of the first order.

After the differential rotational angle $\Delta\varphi$ has been determined, it may be appropriate to process the $\Delta\varphi$-proportional analog signal further in order to calculate the differential angular velocity $\Delta\omega$, the differential rotational angle $\Delta\varphi/\mu$, $\Delta\varphi/\varphi$ and $\Delta\varphi/T$, respectively, accrued per revolution, per angle and per unit time, respectively, especially to determine the transmission ratio of drives. To this end, a first rational measuring process is provided which is suitable for combination both with the basic $\Delta\varphi$ measuring process, the modified basic $\Delta\varphi$ measuring process as well as with the second $\Delta\varphi$ measuring process. The system for performing this first additional measuring process is shown in FIG. 25.

Figure 25:
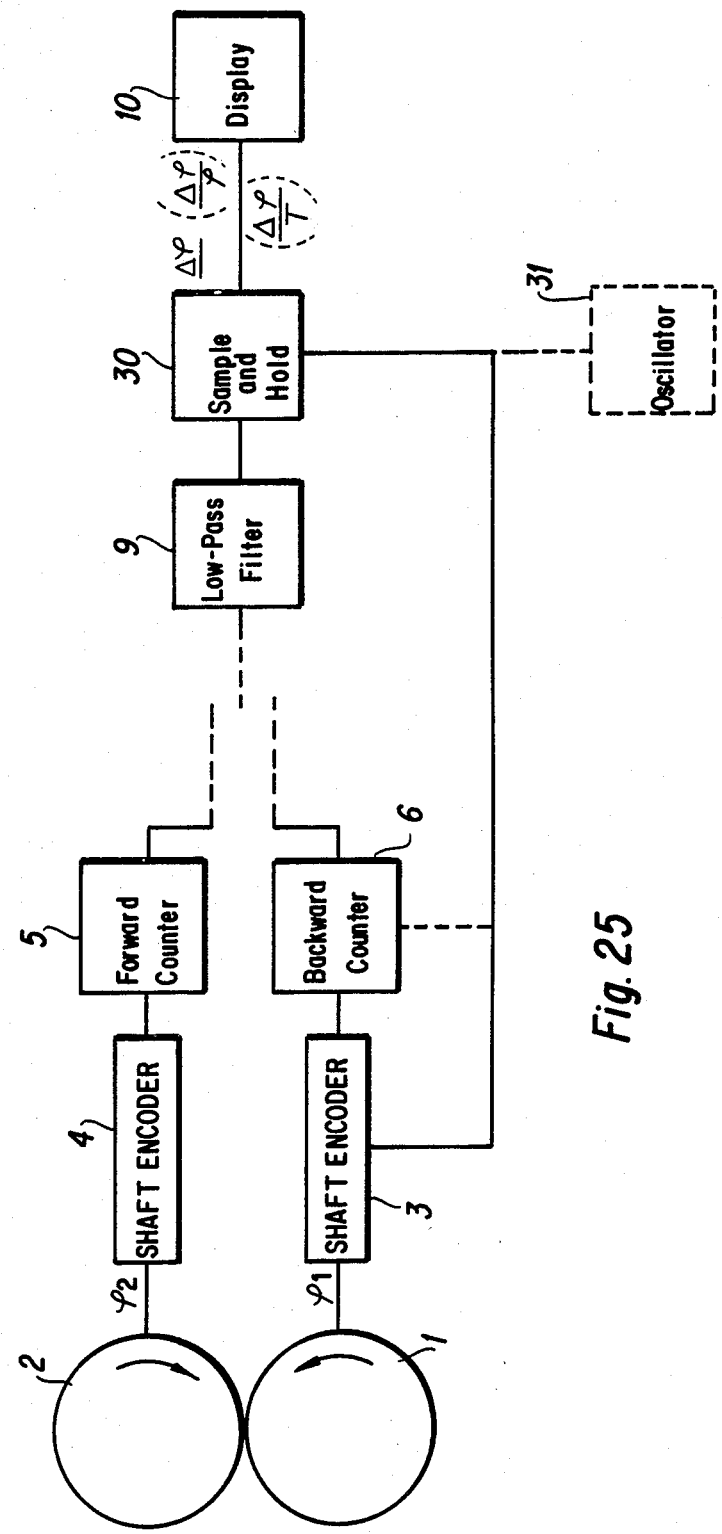
FIG. 25 is a schematic and diagrammatic view of a measuring device for implementing a first supplemental measuring process according to the invention.

As can be seen from FIG. 25, a clock-controlled storage element 30 is connected between the low-pass filter 9 and the indication or display device 10. This clock-controlled storage element 30 is preferably in the form of a sample and hold module. The clock control of the storage element 30 may be effected in three ways:

1. By the zero pulses of the incremental shaft encoders 3 and 4 which are delivered once per revolution. In this case, the sample and hold 30 is coupled with an incremental shaft encoder 3 and 4, respectively. The clock pulse is therefore revolution-dependent.

2. The clock pulses come from the digital counters 5 and 6. Each time a binary number e.g. 2, 4, 16 and so forth, is exceeded, one of the two digital counters 5 and 6, respectively, derives a clock pulse. In this case, the sample and hold 30 must be connected to reset inputs of the two digital counters 5 and 6. The clock pulse is therefore angle-dependent.

3. By setting a fixed frequency as the clock, generated by a separate timer 31, In this case, the sample and hold 30 is coupled with the separate timer 31 which is preferably in the form of a quartz-controlled oscillator. The clock pulse is therefore time-dependent.

The first additional measuring process is described hereinbelow taking for example the clock pulses from the incremental shaft encoder 3. This is done because the generation of clock pulses by one of the digital counters 5 and 6, respectively, as well as by the quartz-controlled oscillator 31, is only schematically indicated in FIG. 26. The generation of clock pulses by the incremental shaft encoder 3 means that the differential rotation angle $\Delta\varphi/\mu$ occurring per revolution of the rotating bodies 1 and 2 in recorded in the clock-controlled storage element 30 i.e. the change in the differential rotational angle $\Delta\varphi$ referenced to the rotational angle covered by cylinder 1 is stored. The desired result is, therefore, the rise in the function $\Delta\varphi$ ($\varphi_1$) over a range of $\varphi_1 = 360°$.

For realization thereof, after N graduations of the incremental shaft encoder 3, a pulse is derived from the backward digital counter 6 and is delivered to the sample and hold 30. As mentioned under item 2 above, it is just as possible to use the so-called zero pulse present in the incremental shaft encoders 3 and 4, respectively, which is generated once per revolution and is likewise delivered to the dample and hold 30. The sample and hold 30 stores the $\Delta\varphi$ value at the time of the pulse until the next pulse arrives. Because the digital counters 5 and 6 are simultaneously reset each time to 0, the $\Delta\varphi$ value starts each time anew from the value zero. Therefore, the output signal of the sample and hold 30 directly represents a signal which is proportional to $\Delta\varphi/\mu$.

Of course, instead of the value $\varphi_1 = 360°$, it is possible to select any desired angle, just as instead of the angle $\varphi_1$ it is possible to select the time as the base (quartz-controlled period T), the signal being then proportional to $\Delta\varphi/\varphi = \Delta\omega$, in this case, as indicated in item 3 above.

Figure 26:
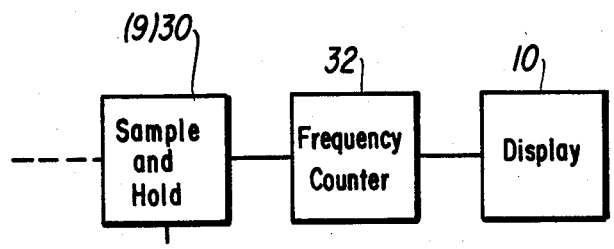
FIG. 26 is a schematic and diagrammatic view of a measuring device for implementing a second supplemental measuring process according to the invention.
Figure 27:
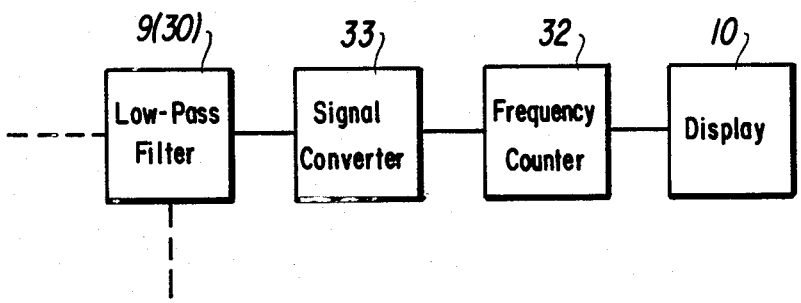
FIG. 27 is a view like that of FIG. 26 showing another mode of the second supplemental measuring process.
Figure 28:
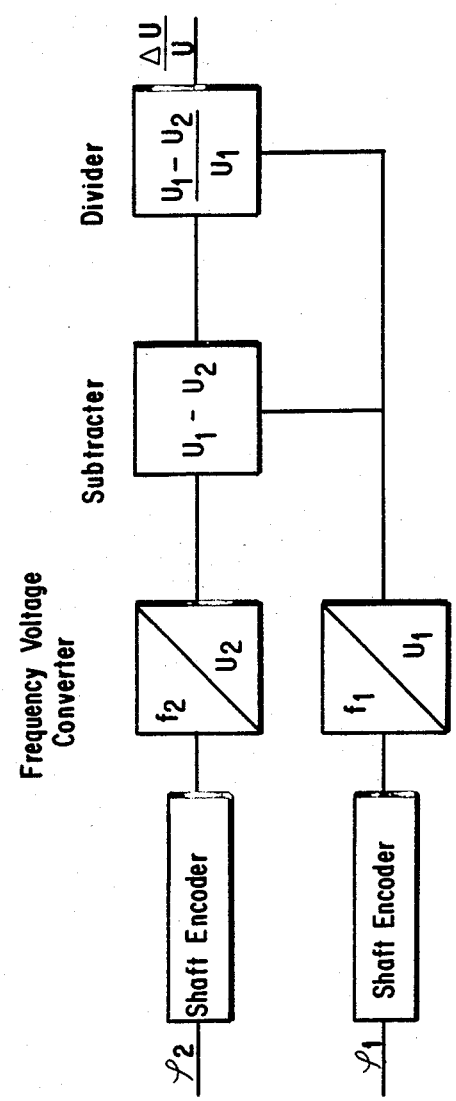
FIGS. 28 to 30 are schematic and diagrammatic views of state-of-the art measuring devices.
Figure 29:
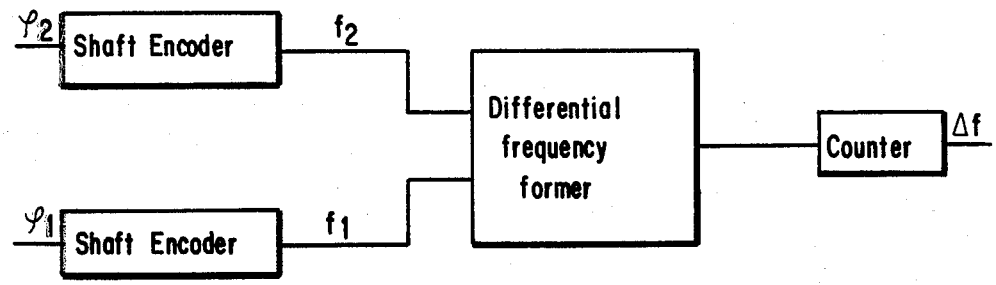
Figure 30:
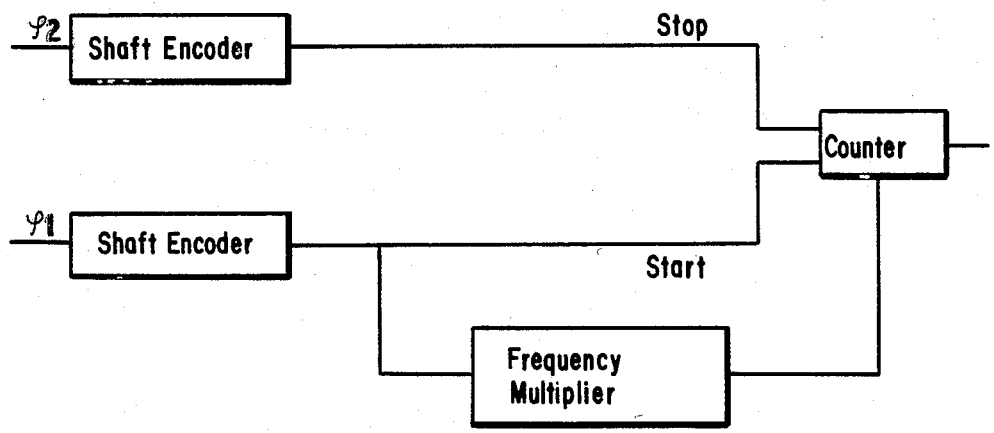

A second additional measuring process having steps which are suitable for combination with all of the hereinafore-mentioned measuring processes and the modifications thereof is shown in FIGS. 26 and 27. In this process the filtered analog signal intended for indication or display and which is proportional to $\Delta\varphi$ is used for determining the frequency so that it is also possible to determine the differential frequency of the pulse trains which is proportional to the differential angular velocity $\Delta\varphi = \Delta\omega$. This is always a practical method when the direction of the differential angular velocity $\Delta\omega$ is preset inherently in the system.

As shown in FIG. 26, this additional measuring process for determining the frequency can be realized by connecting directly forward of the indication means 10, a frequency counter 32 to which the $\Delta\varphi$-proportional analog signal is transmitted. This frequency counter counts whenever a certain voltage level is exceeded, as a result of which the overflow or run-over frequency is recorded per unit time. Another possible arrangement therefor is shown in FIG. 27, the $\Delta\varphi$-proportional analog signal being converted in a signal converter 33, preferably a Schmitt trigger, into a square-wave signal and, subsequently, the overflow or run-over frequency is determined per unit time in the frequency counter 32 by counting the overflows and by counting the number of times the threshold is exceeded, respectively.

The new $\Delta\varphi$ measuring process can be used not only for determining the transmission ratio of individual drive mechanism, but can also be advantageously used for measurements in other technical areas. This process will be of particular interest especially when two nearly equally rapid motions of a rotational and/or translational type are quantized and it is desired to find the position and the change in position, respectively, of the quantizations with respect to one another.

The single side rolling test is frequently used nowadays to check the quality of gear teeth. With the present-day methods, this is only possible at extremely slow rotational speed. Furthermore, a complex computer circuit is required for this. With the new process according to the invention of the instant application, it is possible to test the position of the gearwheels with respect to one another and thus to test the instantaneous transmission ratio throughout the entire speed range. Despite the better resolution thereof, the measuring device according to the invention is simpler and less expensive than heretofore known devices of this general type. Total checking or control of the teeth installed in the machine therefore becomes economically possible. For this application, it is possible to use, apart from the basic $\Delta\varphi$ measuring process, also the modified basic measuring process as well as the additional measuring processes.

Further applications result in cases wherein it is necessary to find the change in rotational angle in relation to a given rotational angle $\Delta\varphi/\varphi$. In friction-gear drives and in cylinder bearers or Schmitt rings, respectively, in offset printing presses, the specified transmission ratio $i = 1$, i.e. identical diameters, is not precisely achieved because of production tolerances. In order to determine the actual transmission ratio, it is necessary to calculate the difference of the circumferences rolling on one another. Because this error, based on one revolution, is $< |10^{-4}|$, a fast reliable measurement is possible only through the new $\Delta\varphi$ measuring process which has a resolution of less than one quantization. Because, furthermore, it can be ascertained whether, due to the manufacturing tolerance, a friction-gear transmission rate is fast or slow, it becomes possible for the first time to improve quality by selecting the friction-gear drives for installation into the press.

A further application relating to angular change per angle results in the measurement of the elastic constants of a travelling paper web. For this, as with the tensile test, it is necessary to have two states of different stress: apart from the stress difference $\Delta\sigma$, it is necessary to measure the strain between both states $\epsilon = \varphi/\varphi$. Accordingly, the ratio $\Delta v/v$ must be measured in the paper web. By eliminating time, $\Delta v/v$ can be transformed into $\Delta\varphi/\varphi$. This valve can be determined with the new $\Delta\varphi$ measuring process according to the invention. In the special case of measuring the modules of elasticity, all previous methods have failed since the differential velocity is lower by a factor of $10^{-4}$ than the reference web velocity, whereas it is still necessary to determine the differential velocity to an accuracy of 4 places. Only the direct measurement of the differential rotational angle $\Delta\varphi$ makes this accuracy possible. To obtain synchronism between two motors and between two rotors, respectively driven by a respective motor, the instantaneous error i.e. the differential angle, is required as information for control purposes. With the previous processes, a synchronism error of ± one quantization of the angle was achieved. Because the differential angle may be measured virtually in real time with almost absolute accuracy with the proces according to the invention, it becomes possible to measure each change in angular position not only in the magnitude thereof, but also in the trend thereof.

IF, for example, two printing units are to be connected by an electric shaft, then, in order to obtain the required synchronism, the associated motor control loop must drive the two printing units with a phase-locked precision hitherto impossible with previous methods. This requires highly accurate information on the position and the change of phase and of the differential rotational angle $\Delta\varphi$, respectively, independently of the speed. This task can be solved in a simple manner by the new $\Delta\varphi$ measuring process according to the invention.

Of course, as noted hereinbefore, the application is not confined to the measuring processes and devices described in the specification and shown in the figures of the drawing. Nor, in particular, it is restricted to the hereinaforementioned areas of application which would merely be viewed as examples which do not limit the invention. It is believed to be readily apparent that the invention permits any desired combinations and expansions of the measuring processes as well as the application thereof to measuring and testing purposes in other technical fields. Furthermore, numerous circuitry modifications and variants are conceivable in the construction of the measuring devices the invention also including within its scope, the substitution and use of equivalent electronic and digital circuit modules.

We claim:

1. Process for high-precision, rotational speed-independent measurement of the phase relationship and phase displacement, respectively, of two pulse trains up to a given high frequency wherein rotational angles of two rotating bodies are quantized and converted by incremental shaft encoders into pulse trains, and the pulse trains are applicable for calculating the respective phase relationship and phase displacement, which comprise the steps of:
   a. counting the pulse trains generated by the two rotational bodies in at least two different counters;
   b. forming a digital difference of the two counts;
   c. converting the digital difference into an analog signal;
   d. decoding the analog signal; and
   e. displaying the decoded analog signal.

2. Process for high-precision, rotational speed-independent measurement of the phase relationship and phase displacement, respectively, of two pulse trains up to a given high frequency wherein rotational angles of two rotating bodies are quantized and converted by incremental shaft encoders into pulse trains, and the pulse trains are applicable for calculating the respective phase relationship and phase displacement, which comprises the steps of:
   a. dividing a measuring range as a function of the rotational angle into a precounter measuring range and an overflow counter measuring range;
   b. counting the pulse trains generated by the two rotational bodies in at least two different counters of a precounter measuring unit;
   c. forming a digital difference of the two counts of the precounter measuring unit;
   d. converting the digital difference of the precounter measuring unit into a first analog signal;
   e. scanning the precounter measuring unit for positive or negative overflow;
   f. in case of overflow, generating appropriate overflow pulses;
   g. in case of delivery of overflow pulses, inverting the highest bit at the adder output of the precounter measuring unit;
   h. counting the positive overflow pulses and the negative overflow pulses, respectively, in two different counters of an overflow counter measuring unit;
   i. forming a digital difference of the two counts of the overflow counter measuring unit;
   j. converting the digital difference of the overflow counter measuring unit into a second analog signal;
   k. analogically adding the first and second analog signals to form a third analog signal;
   l. decoding the third analog signal.

3. Process for high-precision measurement of the phase relationship and phase displacement, respectively, of two pulse trains wherein rotational angles of two rotating bodies are quantized and converted by incremental shaft encoders into pulse trains, and the pulse trains are applicable for calculating the respective phase relationship and phase displacement, which comprises the steps of:
   a. dividing a measuring ranges as a function of the rotational angle into a precounter measuring range and an overflow counter measuring range;
   b. counting the pulse trains in at least two different counters of a precounter measuring unit;
   c. forming a digital difference of the two counts of the precounter measuring unit;
   d. converting the digital difference of the precounter measuring unit into a first analog signal;
   e. scanning the precounter measuring unit for positive or negative overflow;
   f. in case of overflow, generating appropriate overflow pulses;
   g. in case of delivery of overflow pulses, inverting the highest bit at the adder output of the precounter measuring unit;
   h. counting the positive overflow pulses and the negative overflow pulses, respectively, in two different counters of an overflow counter measuring unit;
   i. forming a digital difference of the two counts of the overflow counter measuring unit;
   j. converting the digital difference of the overflow counter measuring unit into a second analog signal;
   k. analogically adding the first and second analog signals to form a third analog signal;
   l. decoding the third analog signal; and further including
   m. limiting the counter capacities according to a differential phase angle $\Delta\varphi$; and
   n. forming the digital difference of the two counts of the precounter and of the overflow counter, respectively, and simultaneously converting the digital difference into an analog signal.

4. Process according to claim 1 wherein the digital difference formation is effected by digitally adding the two counts of a forward counter and of a backward counter.

5. Process according to claim 1 wherein the digital difference formation is effected by digitally subtracting the two counts of two forward counters.

6. Process according to claim 1 wherein the digital difference formation is effected by digitally subtracting the two counts of two backward counters.

7. Process according to claim 1 wherein: the decoding of the analog signal is effected by low-pass filtering.

8. Process according to claim 1 which includes:
a. generating a scanning interval;
b. setting and storing the scanning interval;
c. resetting the phase angle at the start of the scanning interval;
d. storing the phase angle accrued during the scanning interval;
e. resetting anew the phase angle at the end of the scanning interval; and
f. displaying the stored phase angle $\Delta\varphi$ per scanning interval.

9. Process according to claim 8 wherein the scanning interval is revolution-based.

10. Process according to claim 8 wherein the scanning interval is angle-based.

11. Process according to claim 8 wherein the scanning interval is time-based.

12. Process according to claim 1, which includes:
a. scanning and storing the analog signed intended for display which is proportional to a differential rotational angle $\Delta\varphi$;
b. generating a time interval by a separate timer;
c. dividing by the time interval between the scans; and
d. issuing an analog signal which is proportional to the differential angular velocity $\Delta\varphi'$.

13. Process according to claim 1 which includes:
a. scanning and storing the analog signal intended for display which is proportional to a differential rotational angle,
b. generating a time interval by at least one incremental shaft encoder or a counter,
c. dividing by the angular range between the scans; and
d. issuing an analog signal which is proportional to the differential rotational angle per angle $\Delta\varphi/\varphi$ or per revolution $\Delta\varphi/\mu$.

14. Process for high-precision measurement of the phase relationship and phase displacement, respectively, of two pulse trains wherein rotational angles of two rotating bodies are quantized and converted by incremental shaft encoders into pulse trains, and the pulse trains are applicable for calculating the respective phase relationship and phase displacement, which comprise the steps of:
a. counting the pulse trains in at least two difference counters;
b. forming a digital difference of the two counts;
c. converting the digital difference into an analog signal;
d. decoding the analog signal; and
e. displaying the decoded analog signal; the analog signal intended for display which is proportional to a differential rotational angle $\Delta\varphi$ being applicable for determining a frequency.

15. Process for high-precision measurement of the phase relationship and phase displacement, respectively, of two pulse trains wherein rotational angles of two rotating bodies are quantized and converted by incremental shaft encoders into pulse trains, and the pulse trains are applicable for calculating the respective phase relationship and phase displacement, which comprise the steps of:
a. counting the pulse trains in at least two difference counters;
b. forming a digital difference of the two counts;
c. converting the digital difference into an analog signal;
d. decoding the analog signal; and
e. displaying the decoded analog signal; and further including determining a frequency by counting overflows and overflow frequency per unit time, respectively, in a frequency counter.

16. Process for high-precision measurement of the phase relationship and phase displacement, respectively, of two pulse trains wherein rotational angles of two rotating bodies are quantized and converted by incremental shaft encoders into pulse trains, and the pulse trains are applicable for calculating the respective phase relationship and phase displacement, which comprise the steps of:
a. counting the pulse trains in at least two difference counters;
b. forming a digital difference of the two counts;
c. converting the digital difference into an analog signal;
d. decoding the analog signal;
e. displaying the decoded analog signal;
f. scanning and storing the analog signal intended for display which is proportional to a differential rotational angle $\Delta\varphi$;
g. generating a time interval by a separate timer;
h. dividing by the time interval between the scans;
i. issuing an analog signal which is proportional to the differential angular velocity $\Delta\varphi$;
j. prior to determining the frequency, converting the analog signal intended for display, which is proportional to a differential rotational angle $\Delta\phi$, into a square-wave signal.

17. Device for high-precision, rotational speed-independent measurement of the phase relationship and phase displacement, respectively, of two pulse trains up to a given high frequency wherein rotational angles of two rotating bodies are quantized and converted by incremental shaft encoders into pulse trains and the pulse trains are applicable for calculating the respective phase relationship and phase displacement comprising a respective counter afterconnected to each of the two incremental shaft encoders, both of said counters being connected to a common difference former, a digital-/analog converter and a low-pass filter being serially after-connected to said common difference former, and a display device coupled with said low-pass filter.

18. Device for high-precision, rotational speed-independent measurement of the phase relationship and phase displacement respectively, of two pulse trains up to a given high frequency wherein rotational angles of two rotating bodies are quantized by incremental shaft encoders into pulse trains, and the pulse trains are applicable for calculating the respective phase relationship and phase displacement, a measuring range being divided as a function of a phase angle into a precounter measuring range and an overflow counter measuring range comprising a precounter measuring unit having the precounter measuring range assigned thereto and being connected to the incremental shaft encoders, said precounter measuring unit being coupled with an overflow counter measuring unit via an analog comparator and a bit inverter, said overflow counter measuring unit having the overflow counter measuring range assigned thereto, a common analog adder and a low-pass filter being afterconnected to both of said measuring units, said low-pass filter being connected to a display device.

19. Device according to claim 18 wherein: two measuring units are, respectively, formed of two counters, a common difference former being connected to both of said counters as well as a digital/analog converter following said difference former.

20. Device according to claim 19 wherein said two counters are, respectively, formed of a forward and backward digital counter, and said difference former is in the form of a digital adder.

21. Device according to claim 19 wherein both of said counters are in the form of forward digital counters, and said difference former is in the form of a digital substracter.

22. Device according to claim 19 wherein both of said counters are formed as backward digital counters and said difference former is formed as a digital subtracter.

23. Device for high-precision measurement of the phase relationship and phase displacement, respectively, of two pulse trains wherein rotational angles of two rotating bodies are quantized by incremental shaft encoders into pulse trains, and the pulse trains are applicable for calculating the respective phase relationship and phase displacement, a measuring range being divided as a function of a phase angle into a precounter measuring range and an overflow counter measuring range comprising a precounter measuring unit having the precounter measuring range assigned thereto and being connected to the incremental shaft encoders, said precounter measuring unit being coupled with an overflow counter measuring unit via an analog comparator and a bit inverter, said overflow counter measuring unit having the overflow counter measuring range assigned thereto, a common analog adder and a low-pass filter being afterconnected to both of said measuring units, said low-pass filter being connected to a display device, said two measuring units being, respectively, formed of two counters, a common difference former being connected to both of said counters as well as a digital/analog converter following said difference former, said two counters being, respectively, formed of a forward and backward digital counter, and said difference formed bieng in the form of a digital adder, said bit inverter which activates said two counters of said overflow counter measuring unit being connected between the output of said digital adder transmitting the highest bit and said digital/analog converter and being connected to said analog comparator which controls said overflow counter measuring unit and said bit inverter.

24. Device for high-precision measurement of the phase relationship and phase displacement, respectively, of two pulse trains wherein rotational angles of two rotating bodies are quantized by incremental shaft encoders into pulse trains, and the pulse trains are applicable for calculating the respective phase relationship and phase displacement, a measuring range being divided as a function of a phase angle into a precounter measuring range and an overflow counter measuring range comprising a precounter measuring unit having the precounter measuring range assigned thereto and being connected to the incremental shaft encoders, said precounter measuring unit being coupled with an overflow counter measuring unit via an analog comparator and a bit inverter, said overflow counter measuring unit having the overflow counter measuring range assigned thereto, a common analog adder and a low-pass filter being afterconnected to both of said measuring units, said low-pass filter being connected to a display device, said two measuring units being, respectively, formed of two counters, a common difference former being connected to both of said counters as well as a digital/analog converter following said difference former, said two counters being, respectively, formed of a forward and backward digital counter, and said difference formed bieng in the form of a digital adder, said digital difference former as well as said digital/analog converter being realized jointly in an exclusive OR gate, and a limiter being connected to and before said exclusive OR gate.

25. Device according to claim 18 including a clock-controlled storage element connecting said low-pass filter and said display device.

26. Device for high-precision measurement of the phase relationship and phase displacement, respectively, of two pulse trains wherein rotational angles of two rotating bodies are quantized by incremental shaft encoders into pulse trains, and the pulse trains are applicable for calculating the respective phase relationship and phase displacement, a measuring range being divided as a function of a phase angle into a precounter measuring range and an overflow counter measuring range comprising a precounter measuring unit having the precounter measuring range assigned thereto and being connected to the incremental shaft encoders, said precounter measuring unit being coupled with an overflow counter measuring unit via an analog comparator and a bit inverter, said overflow counter measuring unit having the overflow counter measuring range assigned thereto, a common analog adder and a low-pass filter being afterconnected to both of said measuring units, said low-pass filter being connected to a display device, a clock-controlled storage element connecting said low-pass filter and said display device; for clock control, said clock-controlled storage element being connected at least to one of incremental shaft encoders.

27. Device according to claim 25 wherein said clock-controlled storage element is in the form of a sample and hold.

28. Device according to claim 18 including a frequency counter disposed before said display device.

29. Device according to claim 28 including a signal converter connected before and to said frequency counter.

30. Device according to claim 29 wherein said signal converter is formed as a Schmitt trigger.

31. Device according to claim 17 wherein the two rotating bodies are gearwheels, and the high-precision measurement of the phase relationship and phase displacement, respectively, is for single-side rolling testing of said gearwheels.

32. Device according to claim 18 wherein the two rotating bodies are gearwheels, and the high-precision measurement of the phase relationship and phase displacement, respectively, is for single-side rolling testing.

33. Device according to claim 17 wherein the two rotating bodies are cylinder bearing drives of offset printing presses, and the high-precision measurement is for determining the transmission ratio of said drives.

34. Device according to claim 18 wherein the two rotating bodies are cylinder bearer drives of offset printing presses, and the high-precision measurement is for determining the transmission ratio of said drives.

35. Device according to claim 17 wherein the high-precision measurement is for determining the modulus of elasticity of a running paper web.

36. Device according to claim 18, wherein the high-precision measurement is for determining the modulus of elasticity of a running paper web.

37. Device according to claim 17 wherein the two rotating bodies are in two printing units of a printing press, and the high-precision measurement is for determining synchronism of the two printing units.

38. Device according to claim 18 wherein the two rotating bodies are in two printing units of a printing press, and the high-precision measurement os for determining synchronism of the two printing units.

* * * * *